MULTILAYER CONTACT SYSTEM FOR SEMICONDUCTORS

Filed Feb. 1, 1968

INVENTOR.
Clark N. Adams
BY Norman N. Kunitz
ATTORNEY 3,465,211
Patented Sept. 2, 1969

3,465,211

MULTILAYER CONTACT SYSTEM FOR SEMICONDUCTORS

Clark N. Adams, Mountain View, Calif., assignor to Friden, Inc., a corporation of Delaware Filed Feb. 1, 1968, Ser. No. 702,457
Int. Cl. H01l 1/14, 5/02
U.S. Cl. 317—234 11 Claims

ABSTRACT OF THE DISCLOSURE

A multilayer ohmic contact to a semiconductor device wherein the ohmic contact, which is capable of withstanding high processing temperatures up to about 900° C., comprises a very thin film of titanium which contacts the semiconductor surface and extends over the surface of the insulating layer, a film of molybdenum overlying the titanium film, a relatively thin film of a metal such as chromium, titanium, a manganese overlying the molybdenum film, and finally an overlying exposed film of gold. The four films may be deposited by evaporation techniques and etched as described herein.

BACKGROUND OF THE INVENTION

This invention relates to ohmic metal contact to semiconductor devices such as diodes, transistors, integrated circuits or the like. More particularly, this invention relates to multilayer metal contacts capable of withstanding high processing temperatures for use with semiconductor devices, and to methods for making such contacts.

SUMMARY OF THE INVENTION

In semiconductor devices, and particularly in planar semiconductor devices, an insulating layer, usually a silicon oxide or a glass, overlies the surface of the device and electrical connections to the device, as well as interconnections between various regions of the device, are provided by metal films which contact the various regions via openings in the insulating layer and which extend along the surface of the insulating layer to bonding pads. Connections between the device and the package leads are then provided by means of thin wires, normally of gold, extending between the bonding pads and the lead terminals. In general, the metal films used for the contacts and leads must make ohmic contact to the silicon semiconductor material, adhere strongly to the silicon and the silicon oxide insulating layer, provide a low-resistance conductive path, and be formable by state of the art processing techniques, for example by deposition and etching techniques.

At present, the metal most commonly used for providing contacts and leads for silicon semiconductor devices is aluminum. Although aluminum possesses the advantageous properties of high conductivity, good adherence to silicon and silicon oxide, and ease of formation using evaporation and etching techniques, nonetheless it does possess several disadvantages. One of the major limitations to the use of aluminum as a contact metal for silicon is its relatively low eutectic temperature with silicon, i.e., 577° C., a temperature often exceeded during further processing of the device, for example, when the package is hermetically sealed. Since at temperatures exceeding this eutectic temperature, liquid aluminum or other liquid phases formed tend to penetrate the underlying region, the result is a general degradation of the underlying PN junction and often a short circuiting thereof. The use of aluminum as a contact metal also suffers the disadvantage that when gold wires are bonded thereto, a compound, $AuAl_2$, is formed. This compound has extremely poor mechanical properties, resulting in decreased device reliability.

In an attempt to overcome the disadvantages of aluminum, and in view of the fact that no single metal or alloy has been found which is a suitable substitute therefor, it has been proposed that a multilayer metal contact system be employed. In this manner, the most favorable or advantageous characteristics of various metals may be employed, and by careful selection of the combination of metals used to form the multilayer metal system, a lead structure having characteristics superior to those of aluminum may be developed.

One combination of metals which has been proposed for a contact system for silicon semiconductor devices is that of molybdenum and gold, wherein the molybdenum layer is in contact with the silicon and the silicon oxide and the gold layer overlies the molybdenum. In this combination, utilization is made of all the favorable characteristics of gold as a contact metal, namely, high conductivity, ease of deposition and etching, and the obvious compatibility with the gold wires used for bonding. The molybdenum is used to overcome the unfavorable properties of the gold, namely, lack of adherence to silicon oxide, poor electrical contact to silicon, and a very low gold-silicon eutectic temperature, 370° C. Moreover, molybdenum has the additional desirable properties of forming good electrical contacts with silicon, has a very high eutectic temperature with silicon, 1,410° C., and is easily etchable with etchants not incompatible with the other materials present. Additionally, molybdenum does not alloy with gold, and serves as a good diffusion barrier to gold in that gold diffuses therethrough very slowly even at relatively high temperatures.

Although the molybdenum-gold metal contact system for silicon semiconductor devices functions very well for many applications, a number of problems still arise when the devices are subjected to relatively high temperatures, for example, temperatures above 650° to 700° C. In particular, at temperatures above this range, problems of separation or lack of adherence between both the molybdenum film and the silicon oxide layer and between the molybdenum film and the gold film often occur. For this reason, the molybdenum-gold and metal contact system has not, as yet, been universally or at least substantially accepted by the semiconductor industry.

BRIEF DESCRIPTION OF THE INVENTION

The invention overcomes the problems in the molybdenum-gold metal system of the prior art by utilizing two additional metal layers, one between the molybdenum layer and the silicon and silicon oxide, and one between the molybdenum and gold layers, to overcome the non-adherence problems. The resultant four-layer metal system will withstand subsequent temperatures up to approximately 900° C. Briefly, the high temperature contact and lead arrangement according to the invention comprises a very thin film of titanium which ohmically engages the desired region of the surface of a semiconductor substrate via an aperture in the silicon oxide layer covering the surface, and extends out over the surface of the oxide layer. Because of the poor conductivity of titanium and the difficulty in etching titanium with etchants that are compatible with the silicon and silicon oxide, the layer of titanium is preferably not greater than 100 angstroms thick. Such a thickness not only provides a low contact resistance but, moreover, assures a very high sheet resistance for the titanium layer which may then cover the entire surface of the oxide layer even in the finished device. A layer of molybdenum, which in the finished device has been etched so that it conforms to the desired lead and contact geometrical pattern, overlies the thin film of titanium, and a layer, preferably relatively thin, of a metal selected from the group consisting of chromium, titanium, and manganese overlies the molybdenum layer. Finally, a layer of gold is provided overlying the surface of the last-mentioned metallic layer.

In the method according to the invention, after the surface of the silicon semiconductor device has been masked with an oxide layer, the four metal layers, namely, the titanium layer preferably having a thickness not greater than about 100 angstroms, the molybdenum layer, the layer of a metal selected from the group consisting of chromium, titanium, and manganese, and the gold layer, are sequentially deposited on the surface of the semiconductor device. The surface of the gold layer is then masked to provide a pattern having the desired contact and lead configuration, and the unwanted portions of at least the uppermost three metal layers are removed, for example, by selective etching. In view of the very high sheet resistance of the titanium layer due to its extreme thinness, and in view of the difficulty in controllably etching titanium, it is not necessary that this layer be removed.

BRIEF DESCRIPTION OF THE DRAWINGS

The invention and the advantages thereof will be more clearly understood from the following detailed description taken in conjunction with the accompanying drawings wherein.

DESCRIPTION OF THE PREFERRED EMBODIMENT

Figure 1:
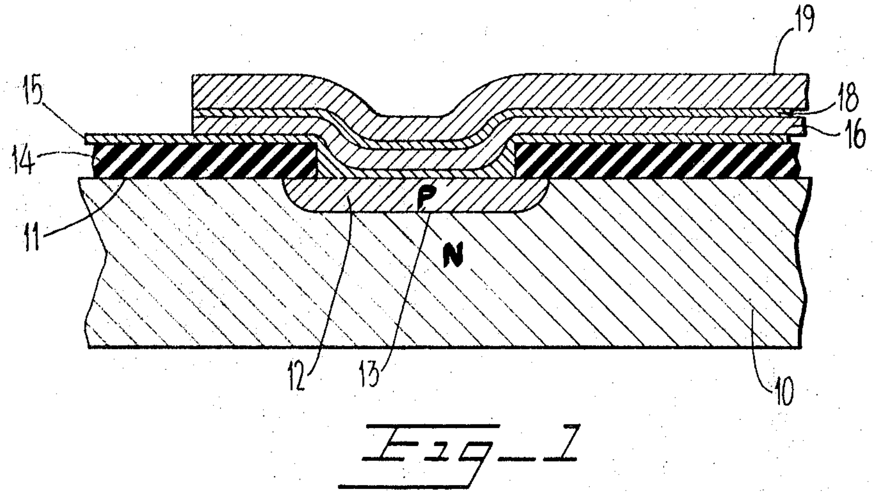
FIG. 1 is a cross-sectional view of a semiconductor device showing the multilayer contact and lead structure according to the preferred embodiment of the invention.

Referring now to FIG. 1, there is shown a semiconductor device in the form of a planar type diode embodying the multilayer contact structure of the invention. The semiconductor device comprises a semiconductor substrate 10 of silicon which has been doped by the inclusion therein of suitable impurities so that it is of a first-conductivity type, N-type as shown. Formed within the wafer 10 adjacent a substantially planar surface 11 thereof is a region 12 of a conductivity type opposite that of the wafer 10, whereby the interface therebetween forms a PN junction 13 which extends the surface 11. The region 12 may be formed by conventional planar techniques of diffusing an impurity via an opening in a silicon oxide mask. Overlying the surface 11 except for an opening or openings therein through which contact may be made to the desired underlying region or regions (the region 12 in the illustrated example) is a protective layer 14 of a suitable insulating material, preferably an oxide of silicon. Electrical contact to the region 12 is provided by means of the multilayer metal system according to the invention which is comprised of the metal layers 15, 16, 18, and 19 formed on the surface of the protective layer 14 by successive metal depositions. Electrical contact to the region may be provided by means of another opening (not shown) in the layer 14, or by another metal layer (not shown) on the bottom surface of the wafer 10.

The metal layer 15 which directly overlies the insulating layer 14 and extends into the opening to ohmically engage the region 12 is formed of titanium metal. Titanium metal. Titanium is chosen for this layer since it forms silicides with silicon, thereby assuring good ohmic contact to the silicon and moreover, provides good adhesion to the silicon oxide layer 14. In view of the poor conductivity of titanium and in order to insure that the contact resistance is maintained within reasonable limits, it is desirable that the layer 15 be very thin, for example, not greater than about 200 to 300 angstroms thick. It should be noted at this time that in addition to possessing the property of poor conductivity, titanium also has the property of being very difficult to controllably etch with etchants that are compatible with the other materials present. Accordingly, if thicknesses in the range mentioned above for the layer 15 are used, then some additional reverse or lifting process steps must be provided in order to remove the unwanted portions of the layer 15 in order to provide the desired final geometrical configurations of the leads. To eliminate the need for this extra processing, according to the preferred embodiment of the invention, the titanium layer 15 is made sufficiently thin so that its sheet resistance will be high enough to prevent short circuits between adjacent contact areas and leads, and hence selective removal thereof is not needed, i.e., the layer 15 remains intact over the entire surface of the insulating layer 15. In order to attain the very high sheet resistances required for this purpose, it has been found that the titanium layer 15 should have a thickness not greater than about 100 angstroms for present-day geometries. Of course, it is to be understood that the actual thickness required is to some extent determined by the spacing between the leads and between contact regions.

Overlying the titanium layer 15 in direct contact therewith is a layer 16 of molybdenum, which in view of the very good solid solubility of titanium in molybdenum, strongly adheres to the layer 15. The thickness of the molybdenum layer 16, although not critical, should be sufficiently thick to prevent diffusion therethrough of the gold used to form the overlying layer 19 at the elevated temperatures to which the device is to be subjected during either processing or use. Thicknesses in the order of 1,000 angstroms for the layer 16 are sufficient to provide a good diffusion barrier between the gold and the silicon. The gold layer 19, since it forms the main conductive path for the contact system, should be relatively thick, for example on the order of about 7,000 angstroms.

In order to improve the adhesion of the gold layer 19 to the molybdenum layer 16 at elevated temperatures, an additional metal layer 18 is formed between the layers 16 and 19 to act as a nucleation film. For this purpose, the layer 18 is comprised of a metal selected from the group consisting of chromium, manganese, and titanium. The thickness of the layer 18, which preferably is of chromium, is not generally critical but should be thick enough to provide a good nucleation layer, while still being thin enough to facilitate ease in processing. For example, when using chromium, the layer 18 should not be greater than about 1,500 angstroms thick and preferably is about 400 angstroms thick. Greater thicknesses for chromium merely tend to increase the difficulty of etching the chromium layer without adding any beneficial attributes. Similar dimensions will also suffice if manganese is used for the layer 18. If titanium, however, is used for the layer 18, then, as mentioned above, in view of the difficulty of etching titanium with etchants compatible with the other materials present, the thickness of the titanium layer 18 should be limited to about 400 angstroms, and preferably should be less than 200 angstroms. With thicknesses of these dimensions, the unwanted portions of the layer 18 may be selectively lifted from the surface after the underlying portions of the molybdenum layer 16 have been etched away.

Figure 2:
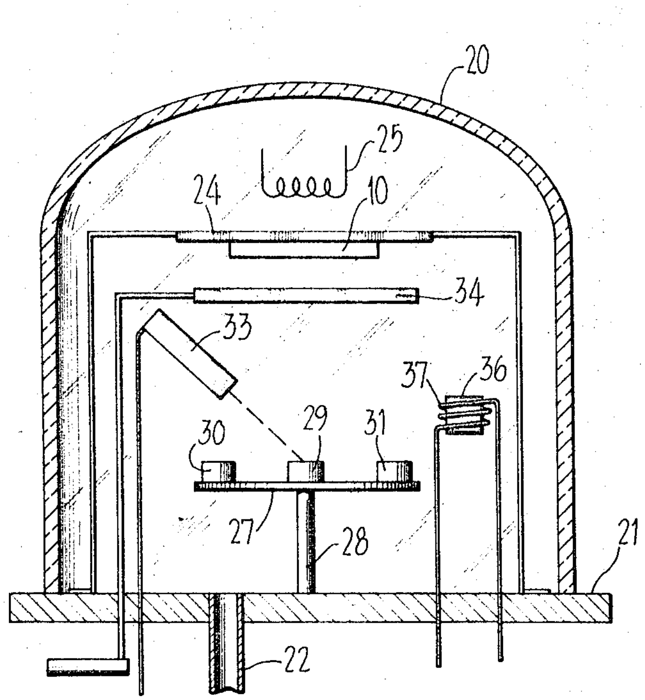
FIG. 2 is a schematic representation of an evaporation chamber which may be used in forming the contact arrangement according to the invention.

Referring now to FIG. 2, there is shown the apparatus for depositing the multilayer metal system shown in FIG. 1. The apparatus used includes an evacuation chamber which comprises a pressure strengthened member or bell jar 20 mounted on a base 21. An opening 22 is provided in the base 21 in order to allow evacuation of the chamber by means of a vacuum pump (not shown). Mounted within the chamber, in a manner whereby it is thermally insulated from the base, is a platen 24, for example, of stainless steel, to the underside of which the wafer or wafers 10 to be metallized are fastened by conventional means (not shown). Mounted within the chamber, beneath the platen 24, is a rotary table 27 supported by a rod 28 fastened to the base 21. The table 27 contains a number of containers or crucibles 29, 30, and 31 which contain the various metals to be deposited and, in particular, titanium, molybdenum, and chromium, respectively. Heating of the various metals contained in the containers 29, 30, and 31 is achieved by means of an electron beam source shown schematically at 33 which can be focused upon any one of the containers by rotation of the table 27. A rotatable shutter 34 is provided within the chamber between the sources of metal and the platen 24 to selectively permit the deposition of evaporated metal on the wafer 10. Also mounted within the chamber is beryllium oxide crucible 36 which contains the gold to be evaporation deposited onto the wafer 10. Heating of the crucible 36 in order to cause evaporation of the gold is brought about by means of an electrical resistance heater 37 surrounding the crucible 36.

In order to carry out the method according to the invention, the wafer 10, after being suitably cleaned and the layer 14 thereof etched to provide the desired contact mask, is fastened to the platen 24 and placed within the evaporation chamber. By means of the vacuum pump attached to the duct 23, the chamber is then evacuated to a pressure $1\times10^{-6}$ torr and, by means of the heater 25, the wafer is then heated to a temperature of about 200° C. With the shutter 34 in a closed position, and the table 27 being rotated to a position whereby the container 29 containing the titanium metal is positioned so that it will be in the path of the electron beam emanating from the electron beam source 33, the source 33 is energized to produce heating and evaporation of the titanium. When a desired titanium deposition rate which is greater than 15 angstroms per second is established (as measured by a conventional measuring device, e.g., a 5 MH crystal monitor), the shutter 34 is opened, thereby allowing the titanium metal to be deposited on the surface of the wafer 10. When desired thickness of titanium (not greater than about 100 angstroms) is formed on the surface, the shutter 34 is closed, thereby preventing any further deposition of titanium, and the power to the electron source 33 is reduced to zero.

Once the power to the electron beam source has been shut off, the table 27 is rotated until the container 30 containing the molybdenum is positioned so that it will be in the path of electrons from the source 33 and the power is reapplied thereto, thereby causing heating and evaporation of the molybdenum. When the deposition rate of the molybdenum has reached a desired rate greater than 10 angstrom per second, the shutter 34 is opened to allow deposition of the molybdenum on the surface of the wafer 10. After about 1,000 angstrom film of molybdenum has been deposited on the wafer, the shutter 34 is again closed and the power to the electron beam source 33 again turned off.

Following the deposition of the molybdenum layer 16, the metal layer 18, which preferably and for the given example of the method is of chromium, is deposited in a similar manner. That is, the table 27 is rotated until the container 31 containing the chromium is located in the path of any electron beam emanating from the electron source 33, and power is supplied to the source 33 to cause heating and consequently evaporation of the chromium. The shutter 34 is maintained in a closed position until a rate of chromium sublimation of about 16 angstroms per second is established. The shutter 34 is then opened for a period of time sufficient to allow the desired thickness of chromium to be deposited. As indicated above, this thickness should not be greater than about 1,500 angstroms, nor less than about 100 angstroms. Preferably, the thickness of the layer 18 should be in the neighborhood of about 400 angstroms of chromium. Following the deposition of required thickness of chromium, the shutter 34 is closed and the power to the electron source 33 is shut off.

In order to deposit the gold film 19, power is then applied to the resistance heater 37 in order to heat the beryllium oxide crucible 36 containing the gold metal. The shutter 34 is again maintained in a closed position until a desired deposition rate in excess of 20 angstroms per second is established. Shutter 34 is then opened and the deposition of the gold metal is allowed to proceed until the gold layer 19 is approximately 7,000 angstroms thick. The shutter 34 is then closed and power to the resistance heater 37 is turned off.

Following the deposition of the gold layer 19, power to the wafer heater 25 is shut off, the pressure in the vacuum chamber is returned to atmospheric pressure, and the wafer 10 is removed from the chamber for further processing to remove unwanted portions of the deposited metal films. Accordingly, a thick coating of a photoresponsive material which will resist etching by the etchants normally used for the various deposited metals, for example, a photoresist polymer such as Eastman Kodak KMER, is applied to the exposed surface of the gold layer 19. The photoresponsive coating is then selectively exposed and etched, using conventional photoetching techniques, to form a mask wherein the photoresponsive material remains only over the areas of the multilayer metal system which are to remain. The wafer 10 is now ready to have the unwanted portions of the metal layers selectively removed.

The unwanted portions of the gold layer 19 are removed by immersing the wafer 10 in an etching solution of potassium tri-iodide. Etching of the gold layer 19 is continued until a visual end point is reached, at which time the wafer is removed from the etching solution and rinsed in deionized water. The wafer 10 is then immersed in a solution of concentrated hydrochloric acid and aluminum chloride ($HCl+AlCl_2$) to remove the unwanted portions of the chromium layer 18. Etching is again continued until a visual end point is reached, after which the wafer is removed from the etching solution and again rinsed in deionized water. The wafer 10 is then once again immersed in an etching solution, in this case a solution of hot concentrated nitric acid, in order to remove the unwanted portions of the molybdenum layer 16. Etching is again carried out to a visual end point, after which the wafer is removed, rinsed in deionized water, and finally the photoresist mask removed by conventional techniques known in the art. The wafer 10 is then ready for scribing to separate the individual semiconductor devices and subsequent lead bonding and packaging.

It should be noted that in the above-described preferred embodiment of the method, after final processing, and as indicated in FIG. 1, the titanium layer 15 remained intact across the entire surface of the wafer 10. As also mentioned above, if it is desired that selective portions of the layer 15 be removed so that it has the same configuration in the finished device as the overlying metal layers 16, 18, and 19, then additional processing of the wafer must be provided. This additional processing may, for example, utilize a lifting technique wherein prior to the deposition of the titanium metal layer 15, a layer of a suitable masking material, such as KMER photoresist, is deposited over the surface of the oxide layer 14 and then selectively exposed and etched to form a reverse field mask of the desired final metal configuration, i.e., masking material covers the areas of the surface of the layer 14 from which it is desired to remove the titanium metal. Either immediately following the deposition of the titanium layer 15, or preferably following the etching of the molybdenum layer 16, the unwanted purtions of the layer 15 may be removed by merely dissolving the underlying masking material.

It should also be noted that in the preferred embodiment of the method, a separate etching step was utilized to remove the unwanted portions of the layer 18 which was comprised of chromium. Similar processing can, of course, be used if the layer 18 is formed of manganese.

However, in the event that this layer is comprised of titanium, then as mentioned above, in view of the difficulty in etching titanium, the layer 18 should not be greater than about 400 angstroms thick, so that the unwanted portions thereof can be lifted from the surface during or after the etching of the underlying molybdenum layer. Such a lifting technique can also be used when the layer 18 is formed from chromium or manganese provided the thickness of the layer 18 does not exceed about 400 angstroms. Obviously, various other modifications of the invention are possible in light of the above teachings without departing from the spirit and scope of the invention. Accordingly, the invention is to be limited only as recited in the appended claims.

What is claimed is:

1. A high temperature contact and lead arrangement for contacting a desired region of the surface of a semiconductor device of the type including a substrate of semiconductor material having a layer of an oxide of silicon upon said surface with said layer having an aperture therein over said region, said contact and lead arrangement comprising a first metallic layer comprised of a very thin film of titanium ohmically engaging said region of said surface within said aperture and extending out over said oxide layer and adherent thereto; a second metallic layer comprised of molybdenum overlying said first metallic layer; a third metallic layer comprised of a metal selected from the group consisting of titanium, manganese, and chromium overlying said layer of molybdenum; and a layer of gold overlying said third metallic layer.

2. The contact and lead arrangement of claim 1 wherein said first metallic layer is not greater than 100 A. thick.

3. The contact and lead arrangement of claim 2 wherein said third metallic layer is chromium.

4. The contact and lead arrangement of claim 3 wherein said third metallic layer is not greater than 1500 A. thick.

5. A high temperature contact and lead arrangement for a semiconductor device of the type including a silicon wafer having a region adjacent a substantially planar surface of said wafer with a P–N junction interposed between said region and the remainder of said wafer, said junction extending to said surface beneath a layer of an oxide of silicon formed on said surface, said contact and lead arrangement comprising: a first metallic film of titanium ohmically engaging the surface of said region via an opening in said oxide layer and extending out over the surface of said oxide layer and adherent thereto, said first film having a thickness not greater than 100 A. whereby said first film has a very high sheet resistance; a second metallic film of molybdenum overlying said first film within said opening and extending along the surface thereof in a desired lead configuration to a position beyond said junction; a third layer of a metal chosen from the group consisting of titanium, chromium, and manganese overlying the entire surface of said second film; and a film of gold overlying said third film.

6. The contact and lead arrangement of claim 5 wherein said third film is chromium and is not greater than 1500 A. thick.

7. The contact and lead arrangement of claim 6 wherein said third film is about 400 A. thick.

8. The contact and lead arrangement of claim 5 wherein said third film is a titanium film which is not greater than 400 A. and preferably less than 200 A. thick.

9. A method of forming a high temperature contact and lead arrangement for a silicon semiconductor device having a silicon oxide mask on a surface thereof comprising:

- depositing a first metal layer of titanium having a thickness not greater than about 100 A. on the exposed portions of said semiconductor surface and said oxide mask;
- depositing a second metal layer of molybdenum over said titanium layer;
- depositing a third metal layer of a metal chosen from the group consisting of chromium, titanium, and manganese on said molybdenum layer;
- depositing a fourth metal layer of gold over said third layer;
- masking the surface of said gold layer to provide a pattern having a desired lead configuration; and
- etching said metal layers to remove the unwanted portions of at least said second, third, and fourth metal layers.

10. A method of forming a high temperature contact and lead arrangement for a silicon semiconductor device having a silicon oxide mask on a surface thereof comprising:

- depositing a first metal layer of titanium on the exposed portions of said semiconductor surface and said oxide mask,
- depositing a second metal layer of molybdenum over said titanium layer,
- depositing a third metal layer of a metal chosen from the group consisting of chromium, titanium, and manganese on said molybdenum layer;
- depositing a fourth metal layer of gold over said third layer;
- masking the surface of said gold layer to provide a pattern having a desired contact and lead configuration; and
- selectively removing the unmasked portions of said second, third, and fourth metal layers.

11. The method of claim 10 including removing the unmasked portion of said first metal layer to provide a four-layer metal contact and lead arrangement having said desired configuration.

References Cited

UNITED STATES PATENTS

| | | | |
|---|---|---|---|
| 3,037,180 | 5/1962 | Linz | 338—327 |
| 3,106,489 | 10/1963 | Lepselter | 117—217 |

JOHN W. HUCKERT, Primary Examiner

J. R. SHEWMAKER, Assistant Examiner

U.S. Cl. X.R.

29—591